(12) United States Patent
Lee et al.

(10) Patent No.: US 6,778,247 B2
(45) Date of Patent: Aug. 17, 2004

(54) METHOD FOR CUTTING TAPE CARRIER PACKAGES OF A LCD AND LCD STRUCTURE

(75) Inventors: Chi-Tien Lee, Tainan (TW); Jiunn-Yau Huang, Pintung Hsien (TW); Mei-Hui Lin, Taipei Hsien (TW); Deuk-Su Lee, Taoyuan Hsien (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 10/227,263

(22) Filed: Aug. 23, 2002

(65) Prior Publication Data

US 2003/0086047 A1 May 8, 2003

(30) Foreign Application Priority Data

Nov. 6, 2001 (TW) .......................................... 90127511 A

(51) Int. Cl.$^7$ .............................................. G02F 1/1345
(52) U.S. Cl. ..................... 349/149; 29/592.1; 29/825; 29/827; 29/830; 29/832; 29/840; 349/150; 349/152
(58) Field of Search ............................... 29/592.1, 825, 29/827, 830, 832, 840; 349/149–152; 439/77, 67; 174/250, 260; 361/749, 748, 803, 728, 789

(56) References Cited

U.S. PATENT DOCUMENTS

| | | | | |
|---|---|---|---|---|
| 4,801,561 A | * | 1/1989 | Sankhagowit ................. | 29/827 |
| 5,075,252 A | * | 12/1991 | Schendelman ............... | 29/593 |
| 5,162,265 A | * | 11/1992 | Roth ..................... | 228/180.21 |
| 5,448,387 A | * | 9/1995 | Kurokawa et al. .......... | 349/150 |
| 5,572,346 A | * | 11/1996 | Sakamoto et al. .......... | 349/150 |
| 5,680,191 A | * | 10/1997 | Voisin et al. ............... | 349/150 |
| 5,724,056 A | * | 3/1998 | Kato ............................ | 345/87 |
| 5,777,855 A | * | 7/1998 | Yokajty ...................... | 361/803 |
| 5,818,562 A | * | 10/1998 | Yoon .......................... | 349/149 |
| 5,949,512 A | * | 9/1999 | Taguchi ...................... | 349/150 |
| 6,050,830 A | * | 4/2000 | Tanaka ........................ | 439/67 |
| 6,123,551 A | * | 9/2000 | Westfall ...................... | 439/67 |
| 6,133,978 A | * | 10/2000 | Tajima ........................ | 349/150 |
| 6,172,732 B1 | * | 1/2001 | Hayakawa et al. ......... | 349/152 |
| 6,191,838 B1 | * | 2/2001 | Muramatsu ................. | 349/149 |
| 6,300,997 B1 | * | 10/2001 | Saito et al. ................. | 349/149 |
| 6,396,557 B1 | * | 5/2002 | Tajima ........................ | 349/150 |
| 6,407,796 B2 | * | 6/2002 | Tajima et al. ............... | 349/150 |
| 6,417,897 B1 | * | 7/2002 | Hashimoto ................... | 349/65 |
| 6,495,768 B1 | * | 12/2002 | Cho ........................... | 174/250 |
| 2001/0020996 A1 | * | 9/2001 | Ueda et al. ................. | 349/149 |

FOREIGN PATENT DOCUMENTS

JP 02285663 A * 11/1990 .................. 29/827

* cited by examiner

Primary Examiner—Karl D. Frech
Assistant Examiner—Daniel Walsh
(74) Attorney, Agent, or Firm—Needle & Rosenberg, P.C.

(57) ABSTRACT

A cutting method of a tap carrier package of a liquid crystal display. The cutting method cuts a film comprising a first straight layout along a predetermined direction on a wiring layer comprising a second straight layout along the predetermined direction and a oblique layout, the method comprises the following steps. First, a breach is formed by cutting a part of the first straight layout on the film. Finally, the film is fastened on the wiring layer. Thus, the remaining first straight layout is only connected to the straight layout and the oblique layout is exposed through the breach.

1 Claim, 4 Drawing Sheets

METHOD FOR CUTTING TAPE CARRIER PACKAGES OF A LCD AND LCD STRUCTURE

The present application is a 35 U.S.C. § 119 utility application from, and claims priority to, Taiwanese application 90127511, filed Nov. 6, 2001, which application is incorporated herein in its entirety by this reference.

BACKGROUND OF THE INVENTION

1. Field of the Invention

The present invention relates to a liquid crystal display, and more particularly to an improved liquid crystal display apparatus and method for checking the joining accuracy thereof.

2. Description of the Related Art

Conventionally, a liquid crystal display apparatus comprises a panel, a drive circuit and a control circuit. The pixels on the panel are driven by the drive circuit and the control circuit is designed to manipulate the drive circuit to control images displayed on the panel. In a liquid crystal display apparatus, the drive circuit is generally set on tape carrier packages (TCP) and the control circuit is laid out on a control circuit board. The TCP is coupled to the panel and the control circuit is coupled to the TCP, wherein the pins on the control circuit are constrained in a predetermined ring to correspond with pins on the TCP to maintain the display quality of the liquid crystal apparatus.

FIG. 1 shows the conventional circuit layout of TCP. The TCP circuit is printed on a film 10. The driving chip 11 provides driving signals of a panel. One terminal of the TCP OLB pads 12 is connected to the driving chip 11, and the other terminal is connected to the responding testing pad 14. Electric testing is performed to confirm that OLB pads connected to the driving chip 11 are not shorted or broken. After electric testing, the cutting of the film 10 is performed. The cutting region is the rectangle region indicated by number 16. After the cutting, the remained part does not include testing pads 14.

FIG. 2 shows one conventional example of the circuit layout between the color filter 20 and the matrix glass 21. As shown in FIG. 2, the layouts of the cell OLB pad 220 on the conventional wiring layer 22 are straight lines.

Next, the OLB pads 12 of the cut TCP circuit 16 are connected to the corresponding output lead 220 of the wiring layer 22. Thus, the driving chip 11 is connected to the LCD panel.

However, the layout of the output lead 220 of the wiring layer 22 is not suited for straight layout presently because circuit layouts are getting more complicated and the allowed layout region is getting smaller. Thus, the direction of some part of the layout is horizontal or oblique. FIG. 3 shows another conventional example of the circuit layout between the color filter 20 and the matrix glass 21. As shown in FIG. 3, the layouts of the cell OLB pad 220 comprise straight layout 321A and the horizontal or oblique layout 321B.

Thus, electric shorts occur when the OLB pads 12 of the cut TCP circuit 16 in FIG. 1 are connected to the corresponding output lead 320 of the wiring layer 32. FIG. 4 shows the TCP circuit 16 located on the wiring layer 32 of an LCD. The number 40 represents the combining region of the TCP circuit 16 and the wiring layer 32 of an LCD panel. The number 42 represents the TCP OLB pads 12 of the TCP circuit 16 shorting with the horizontal or oblique layout 321B of the wiring layer 32.

To solve the short problem, the conventional method changes the layout of the wiring layer 32. However, as the allowed layout region gets smaller, it is difficult to avoid electric shorts by changing layout.

SUMMARY OF THE INVENTION

The object of the present invention is to provide an LCD structure and a cutting method of tap carrier package of a liquid crystal display by cutting the structure of the tap carrier package to avoid electric shorts in the combining region of the TCP circuit and the wiring layer of the LCD panel.

To achieve the above-mentioned object, the present invention provides a cutting method of tap carrier package of a liquid crystal display. The cutting method cuts a film comprising a first straight layout along a predetermined direction on a wiring layer comprising a second straight layout along the predetermined direction and a oblique layout, the method comprising the following steps. First, a breach is formed by cutting a part of the first straight layout on the film. Finally, the film is fastened on the wiring layer. Thus, the remaining first straight layout is only connected to the straight layout and the oblique layout is exposed through the breach.

Moreover, the present provides a liquid crystal display, comprising a panel, a wiring layer, and a tap carrier package. The wiring layer has a first layout comprising a straight layout along a predetermined direction and an oblique layout. The tap carrier package has a breach and a second layout along the predetermined direction. The tap carrier package is located on the wiring layer, the second layout is coupled to the straight layout and the oblique layout is exposed through the breach.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 3:
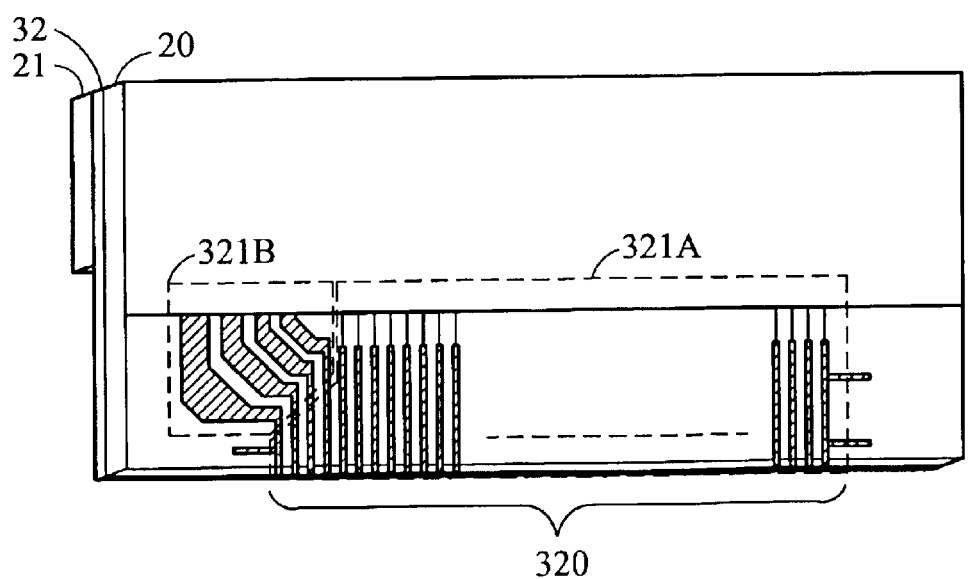
FIG. 3 shows another conventional example of the circuit layout between the color filter 20 and the matrix glass 21.
Figure 4:
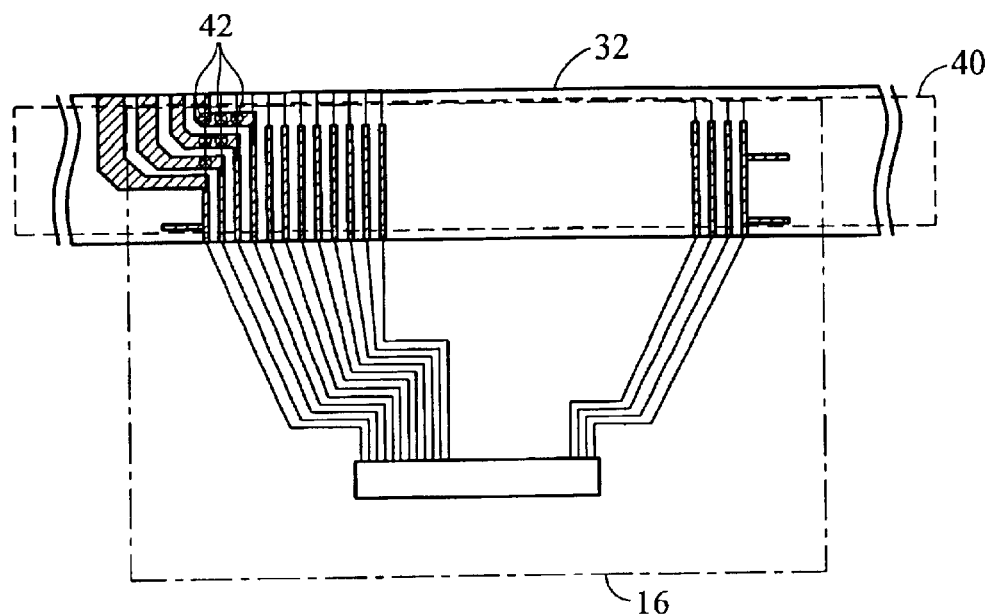
FIG. 4 shows the TCP circuit 16 located on the wiring layer 32 of a LCD.
Figure 5:
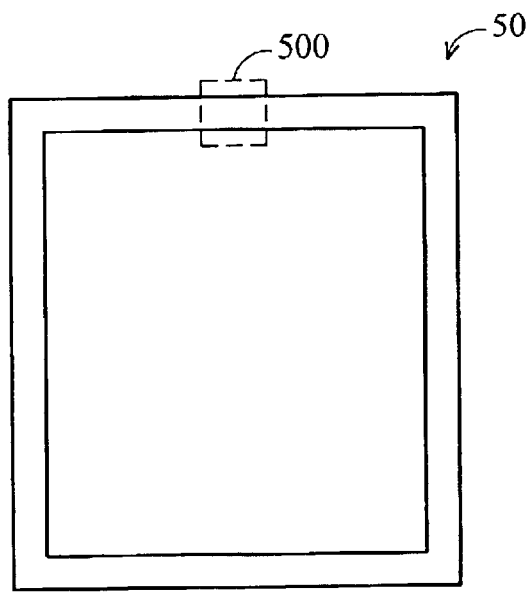
FIG. 5 shows the outward appearance of the LCD according to the present invention.

FIG. 5 shows the outward appearance of the LCD according to the present invention. The LCD according to the present invention comprises a LCD panel 50. Number 500 represents a circuit layer 32 in the LCD panel 50. The circuit layer 32 is located between the color filter 20 and the matrix glass 21. The circuit layer 32 comprises cell OLB pad 320 and the layouts of the cell OLB pad 320 comprise the straight layout 321A and the horizontal or oblique layout 321B (shown in FIG. 3).

Figure 1:
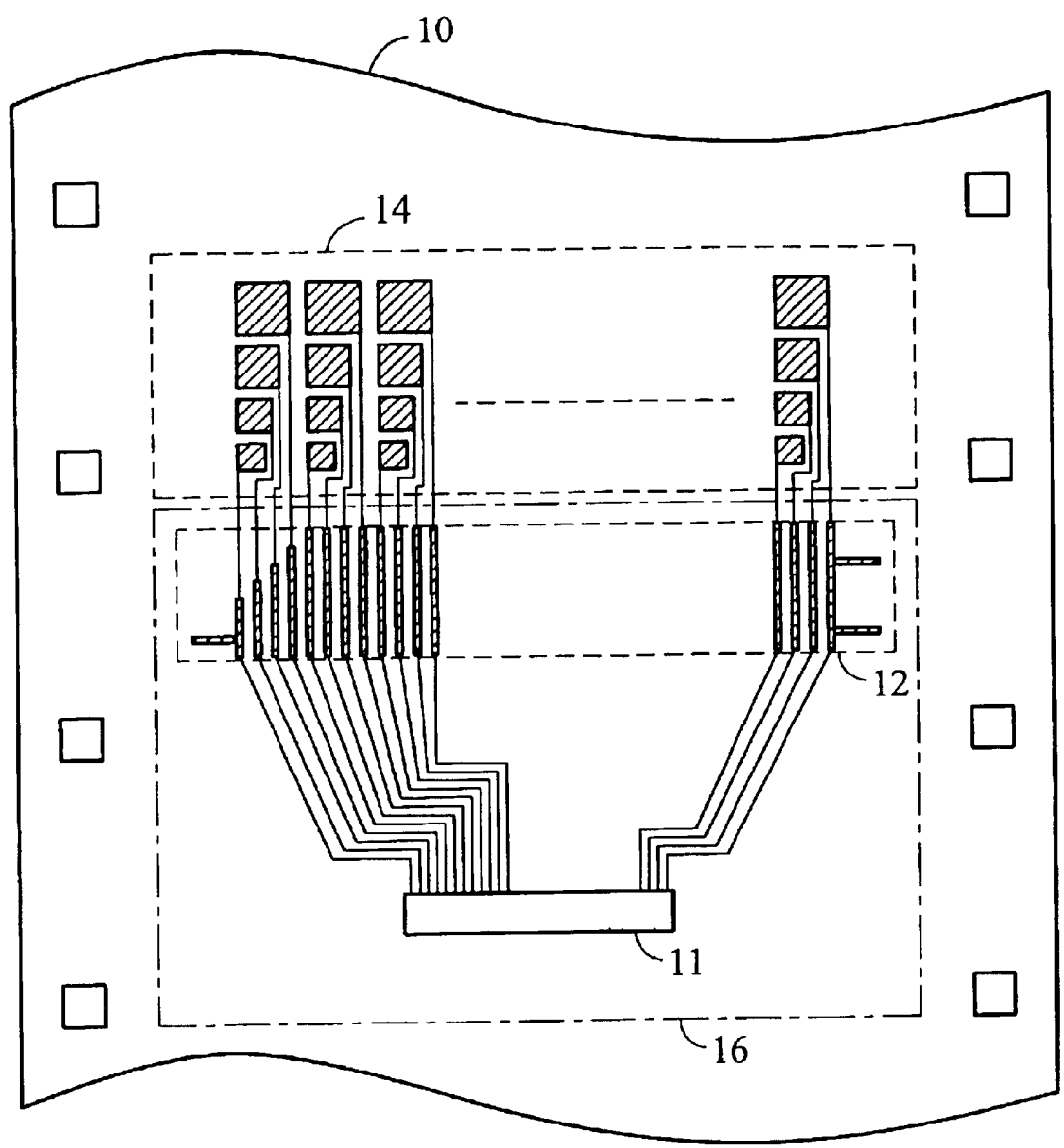
FIG. 1 shows the conventional circuit layout of TCP. The TCP circuit is printed on a film 10.
Figure 2:
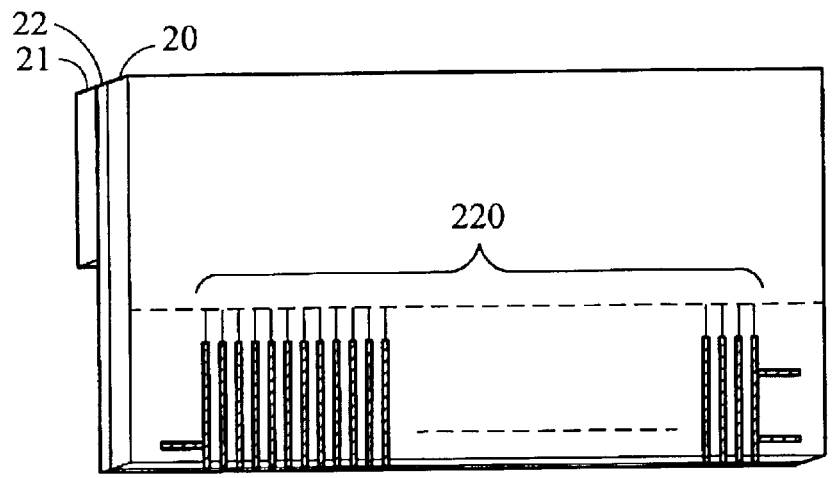
FIG. 2 shows one conventional example of the circuit layout between the color filter 20 and the matrix glass 21.

In FIG. 1, the TCP circuit is printed on a film 10. The driving chip 11 provides driving signals to a panel. One terminal of the TCP OLB pads 12 is connected to the driving chip 11, and the other to the responding testing pad. The electric testing is performed to confirm that the OLB pads connected to the driving chip 11 are without shorts and unbroken. After electric testing, the cutting of the film 10 is performed.

Figure 6:
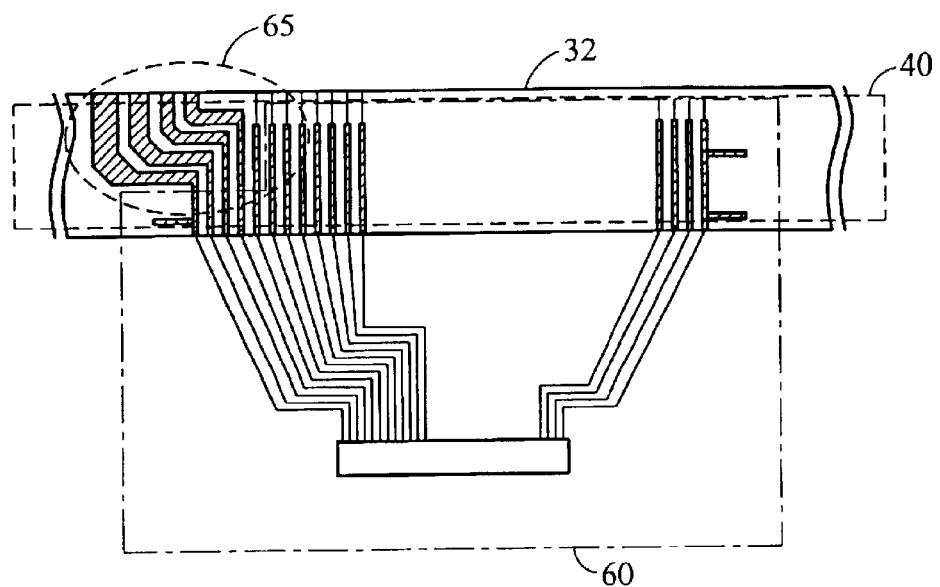
FIG. 6 shows the TCP circuit 60 located on the wiring layer 32 according to an embodiment of the present invention.

After the cutting method according to the present embodiment, a TCP circuit 60 is formed. FIG. 6 shows the TCP circuit 60 located on the wiring layer 32 according to the embodiment of the present invention. There is a breach 65 on the TCP circuit 60. Next, the OLB pads 12 of the cut TCP circuit 60 are connected to the corresponding output lead 220 of the wiring layer 32. Thus, the driving chip 11 is connected to the LCD panel.

When the TCP circuit 60 combines with the wiring layer 32, the horizontal or oblique layout 321B is not covered by the TCP circuit 60. With the design of the breach 65, the TCP OLB pads 12 do not extend to the horizontal or oblique layout 321B. Thus, the electric shorts in the combining region 40 of the TCP circuit 60 and the wiring layer 32 of a LCD panel are avoided.

Figure 7:
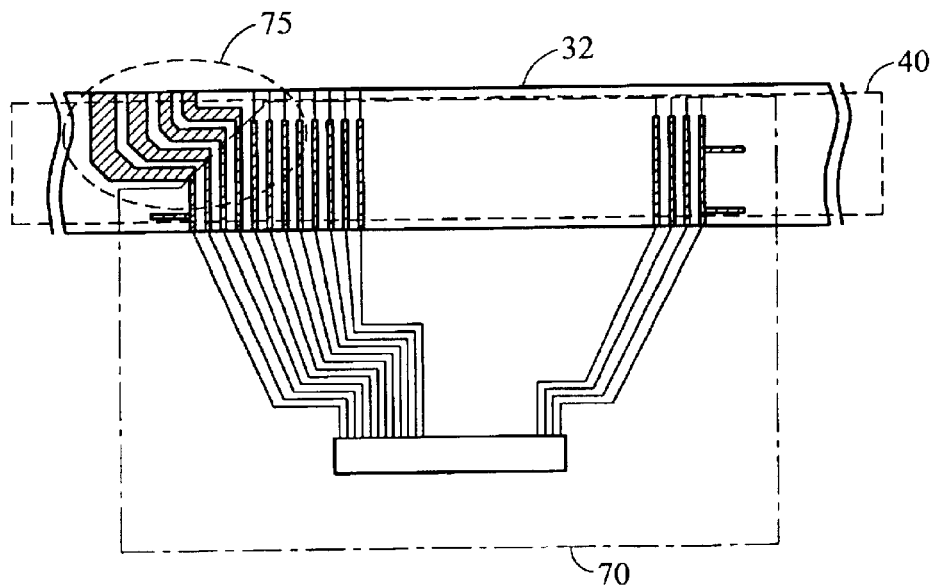
FIG. 7 shows the TCP circuit 70 located on the wiring layer 32 according to another embodiment of the present invention.

FIG. 7 shows the TCP circuit 70 located on the wiring layer 32 according to another embodiment of the present invention. After the film 10 is cut by the method according to this embodiment, a TCP circuit 70 is formed. The difference between the TCP circuit 70 and the TCP circuit 60 is that the edge of the breach 75 is extended along the boundary between the straight layout 321A and the horizontal or oblique layout 321B.

When the TCP circuit 70 combines with the wiring layer 32, the horizontal or oblique layout 321B is not covered by the TCP circuit 70, so the TCP OLB pads 12 do not extend to the horizontal or oblique layout 321B. Thus, the electric shorts in the combining region 40 of the TCP circuit 70 and the wiring layer 32 of a LCD panel are avoided.

Thus, electric shorts are avoided by changing the structure of the TCP circuit without changing the layout of the wiring layer.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A cutting method of a tape carrier package of a liquid crystal display for cutting a film comprising a first straight layout along a predetermined direction on a wiring layer including a second straight layout along the predetermined direction and a oblique layout, the method comprising the following steps:

forming a breach by cutting a part of the first straight layout when cutting the film; and fastening the film on the wiring layer, wherein the remaining first straight layout is only connected to the straight layout and the oblique layout is exposed through the breach.

* * * * *